(12) United States Patent
Kuhn et al.

(10) Patent No.: US 9,444,048 B2
(45) Date of Patent: *Sep. 13, 2016

(54) CIRCUITRY INCLUDING RESISTIVE RANDOM ACCESS MEMORY STORAGE CELLS AND METHODS FOR FORMING SAME

(71) Applicants: Peter J. Kuhn, Austin, TX (US); Feng Zhou, Austin, TX (US)

(72) Inventors: Peter J. Kuhn, Austin, TX (US); Feng Zhou, Austin, TX (US)

(73) Assignee: Freescale Semiconductor, Inc, Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/594,653

(22) Filed: Jan. 12, 2015

(65) Prior Publication Data

US 2015/0124519 A1    May 7, 2015

Related U.S. Application Data

(63) Continuation of application No. 13/484,326, filed on May 31, 2012, now Pat. No. 8,934,282.

(51) Int. Cl.
*G11C 11/00* (2006.01)
*H01L 45/00* (2006.01)
(Continued)

(52) U.S. Cl.
CPC ....... *H01L 45/1641* (2013.01); *G11C 13/0007* (2013.01); *G11C 13/0021* (2013.01); *G11C 13/0069* (2013.01); *G11C 29/006* (2013.01); *G11C 29/028* (2013.01); *G11C 29/04* (2013.01);
(Continued)

(58) Field of Classification Search
CPC ....... G11C 27/005; G11C 27/00; G11C 7/16; G11C 27/024; G11C 27/04; G11C 13/0004; G11C 11/16; G11C 13/0011; G11C 13/0014; G11C 2213/79; G11C 17/16; G11C 13/004; G11C 11/28; G11C 13/0069; G11C 13/0007; G11C 2213/72; G11C 11/15; G11C 11/5678; G11C 2213/78; G11C 11/39; G11C 11/412; G11C 29/50; G11C 11/401; G11C 29/02; G11C 29/34; B82Y 10/00; G09G 3/297; G09G 3/296; H01J 11/12; G06F 3/0386; H01L 43/08; H01L 27/228; H01L 27/108; H01L 29/7841; H05K 999/99
USPC ........... 365/45, 46, 100, 116, 148, 158, 163, 365/174, 201
See application file for complete search history.

(56) References Cited

U.S. PATENT DOCUMENTS

2010/0157710 A1* 6/2010 Lambertson ............ G11C 11/36
                                                         365/218
2010/0232209 A1   9/2010 Kawabata et al.
(Continued)

OTHER PUBLICATIONS

Baek et al.; "Highly Scalable Non-volatile Resistive Memory using Simple Binary Oxide Driven by Asymmetric Unipolar Votage Pulses"; IEEE International Electron Devices Meeting, 2004; Dec. 13-15, 2004; pp. 587-590.
(Continued)

*Primary Examiner* — Fernando Hidalgo

(57) ABSTRACT

A method of forming a circuitry includes providing a substrate comprising a plurality of die. Each die includes a plurality of resistive random access memory (RRAM) storage cells. The method further includes concurrently initializing substantially all of the RRAM storage cells on the same wafer. Initializing can include applying a voltage potential across the RRAM storage cells.

18 Claims, 8 Drawing Sheets

(51) Int. Cl.
*G11C 29/00* (2006.01)
*G11C 29/02* (2006.01)
*G11C 13/00* (2006.01)
*G11C 29/04* (2006.01)
*H01L 27/24* (2006.01)

(52) U.S. Cl.
CPC ... *H01L 27/2463* (2013.01); *G11C 2013/0083* (2013.01); *G11C 2013/0088* (2013.01); *G11C 2029/0403* (2013.01)

(56) References Cited

U.S. PATENT DOCUMENTS

| | | |
|---|---|---|
| 2011/0063887 A1 | 3/2011 | Kanda |
| 2011/0317480 A1 | 12/2011 | Lung et al. |
| 2012/0075944 A1 | 3/2012 | Ide et al. |
| 2012/0251737 A1 | 10/2012 | Osaki et al. |
| 2012/0261635 A1 | 10/2012 | Zhou et al. |
| 2012/0261636 A1 | 10/2012 | Zhou et al. |
| 2013/0107605 A1* | 5/2013 | Chen .............. G11C 13/0002 365/148 |
| 2013/0127018 A1 | 5/2013 | Phua et al. |
| 2013/0221307 A1 | 8/2013 | Wang et al. |

OTHER PUBLICATIONS

Chen et al.; "Highly Uniform Bipolar Resistive Switching with Al(2)O(3) Buffer Layer in Robust NbAlO-Based RRAM"; IEEE Electron Device Letters; vol. 31, No. 4; Apr. 2010; pp. 356-358.

Lee et al.; "Stack Friendly All-Oxide 3D RRAM using GaInZnO Peripheral TFT Realized Over Glass Substrates"; IEEE International Electron Devices Meeting, 2008; Dec. 15-17, 2008; 4 Pages.

Sawa; "Resistive Switching in Transition Metal Oxides"; Materials Today; vol. 11, No. 6; Jun. 2008; pp. 28-36.

Terai et al.; "Effect of ReRam-Stack Asymmetry on Read Disturb Immunity"; IEEE 47th Annual International Reliability Physics Symposium; Montreal; Apr. 26-30, 2009; pp. 134-138.

Tsunoda et al.' "Low Power and High Speed Switching of Ti-doped NiO ReRAM under the Unipolar Voltage Source of less than 3 V"; IEEE International Electron Devices Meeting; Dec. 10-12, 2007; pp. 767-770.

Yoon et al.; "Vertical Cross-point Resistance Change Memory for Ultra-High Density Non-volatile Memory Applications"; 2009 Symposium on VLSI Technology Digest of Technical Papers; Jun. 16-18, 2009; pp. 26-27.

Terai et al.; "Resistance Controllability of Ta(2)O(5)/TiO(2) Stack ReRAM for Low-Voltage and Multilevel Operation"; IEEE Electron Device Letters; vol. 31, No. 3; Mar. 2010; pp. 204-206.

\* cited by examiner

CIRCUITRY INCLUDING RESISTIVE RANDOM ACCESS MEMORY STORAGE CELLS AND METHODS FOR FORMING SAME

CROSS-REFERENCE TO RELATED APPLICATION(S)

This application is a continuation of U.S. patent application Ser. No. 13/484,326 filed May 31, 2012, now U.S. Pat. No. 8,934,282, the entirety of which is herein incorporated by reference.

FIELD OF THE DISCLOSURE

This disclosure, generally relates to an electronic device including memory, and more particularly to devices including resistive random access memory storage cells and circuitry formed by such methods.

BACKGROUND

Industry is experiencing an ever-increasing demand for computational circuitry along with an ever-increasing demand for improved performance, greater integration, and lower cost. With such demand, there is an increasing desire to incorporate nonvolatile memory that exhibits high access rates, occupies little space, and exhibits low power consumption. Such non-volatile memory can be integrated with additional circuitry, such as a microprocessor, a microcontroller, a smart sensor, or other computational circuitries. Alternatively, such nonvolatile memory can be provided on a separate substrate accessible through a high-speed bus.

However, with increased integration comes an increase in cost, particularly in view of increased complexity and higher cost of defective parts. Furthermore, with increased integration, the process of forming such computational circuitries becomes more complicated and costly, particularly when the additional testing steps are performed on individual die. Moreover, space is limited on such integrated circuitry, particularly with modern commercial demands for smaller and more compact devices.

BRIEF DESCRIPTION OF THE DRAWINGS

The present disclosure may be better understood, and its numerous features and advantages made apparent to those skilled in the art by referencing the accompanying drawings.

The use of the same reference symbols in different drawings indicates similar or identical items.

DESCRIPTION OF THE PREFERRED EMBODIMENT(S)

In an exemplary embodiment, a wafer includes a plurality of die. Such die can include a plurality of Resistive Random Access Memory (RRAM) storage cells, each of which are to be initialized prior to being available for programming and erasing. In particular, the RRAM storage cells can form one or more storage cell arrays on the die of the wafer. The die can further include circuitry to function as a microcontroller, a microprocessor, smart sensor, or other integrated circuitry. At the wafer level, the RRAM storage cells can be initialized, enabling them for set and reset operations. In particular, the RRAM storage cells can be initialized concurrently. As used herein, initializing includes altering the storage medium, for example, to provide cells that can be adjusted through two or more resistive states, and permitting the storage cells to act as data storage, which according to an embodiment can include non-volatile data storage.

In an embodiment, a method for forming an integrated circuit device includes providing a wafer having a plurality of die. Each die can include one or more RRAM storage cell array. The method further includes initializing the RRAM storage cell arrays at the wafer level, prior to die assembly and packaging. For example, substantially all of the RRAM storage cells of a die on the wafer can be initialized concurrently. In another embodiment, substantially all of the RRAM storage cells of the wafer are initialized concurrently. In an example, the RRAM storage cells are initialized by applying a charge potential across each of the storage cell of arrays concurrently. In an embodiment, the charge potential is created by applying a voltage to a conductive node connected to the storage cells. In another embodiment, the charge potential is created by exposing the wafer to a charged plasma within a plasma chamber. In a further example, the charge potential is created by exposing the RRAM storage cells to radiation, referred to herein as initializing radiation, such as UV radiation, gamma radiation, x-ray radiation, or a combination thereof. Optionally, the storage cell arrays can be tested at a wafer level and good or bad die can be identified prior to packaging and assembly.

Figure 1:
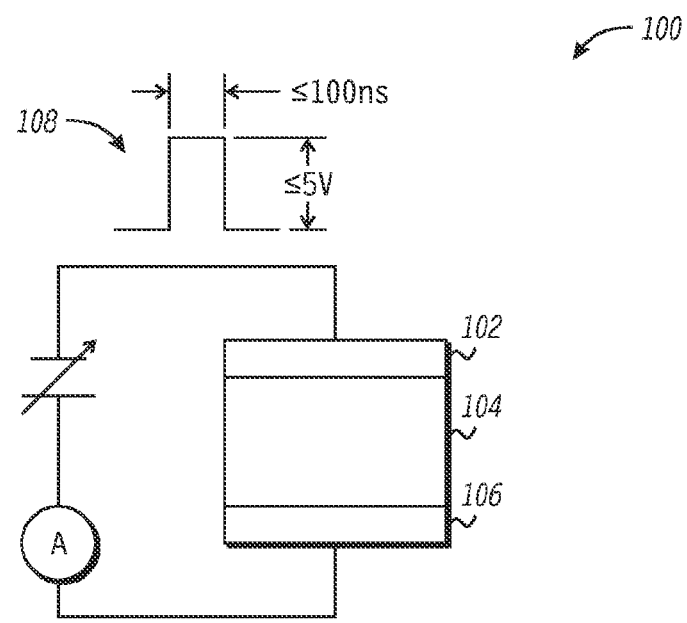
FIG. 1 includes an illustration of an exemplary resistive random access memory (RRAM) storage cell.

As illustrated in FIG. 1, an RRAM storage cell 100 includes a storage medium 104 disposed between electrodes 102 and 106, which when initialized can assume two or more resistive states, which can be used to represent data values, such as one of two bit states. In particular, programming and erase operations can bias the storage cell 100 such that its state is changed to a desired state. For example, a pulse 108 can have a voltage of not greater than 5 V and can have a duration of not greater than 100 ns and can be used to set the storage cell 100 in a relatively non-conductive state or a relatively conductive state depending on the nature of the storage medium 104, and the relative direction and magnitude of voltage potential applied across the storage medium 104. A different pulse can be supplied across the storage cell 100 and the current can be measured to determine the state of the storage cell 100. Generally, pulses to measure the state of the storage cell 100 apply a lower voltage potential across the storage medium 104 than pulses that change the state of the storage cell 100.

The electrodes 102 or 106 can be formed of metallic or conductive ceramic materials. An exemplary metallic material for use as an electrode can include titanium, copper, aluminum, gold, platinum, silver, nickel, rubidium, tungsten, or a combination thereof. An exemplary conductive ceramic material includes titanium nitride, indium tin oxide, or a combination thereof.

The storage medium 104 can be formed of one or more layers of materials that can assume two or more resistive states. In particular, each state of the storage medium 104 exhibits a different resistance. The storage medium 104 can be formed of one or more layers of ceramic material, such as transition metal oxides, perovskite ceramics, or a combination thereof. An exemplary material for use as storage medium 104 can include alumina, hafnium oxide, silica, nickel oxide, tungsten oxide, zinc oxide, zirconium oxide, calcium manganese ceramic, titanium oxide, doped derivatives thereof, or a combination thereof.

Figure 2:
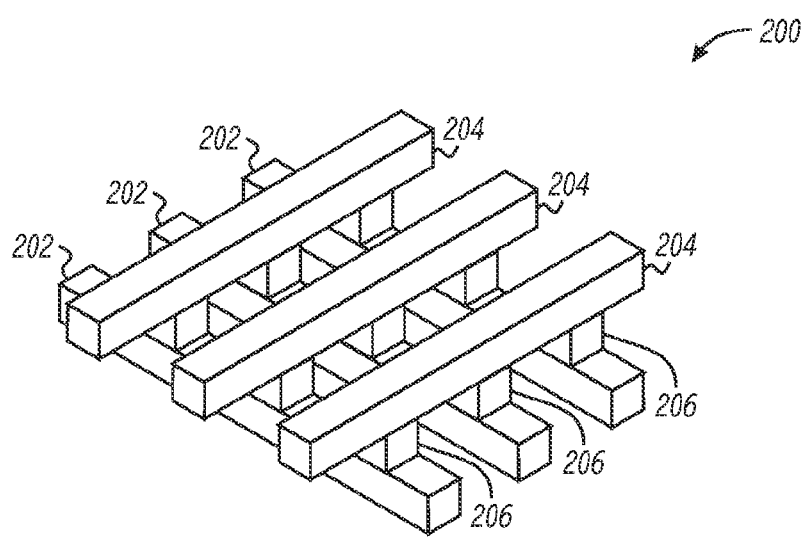
FIG. 2 includes an illustration of an exemplary array of RRAM storage cells.

FIG. 2 includes an illustration of an array 200 of RRAM storage cells. For example, the array of RRAM storage cells include sets of word lines 202 and bit lines 204 disposed on opposite sides of a set of storage media 206. The word lines 202 and bit lines 204 can be formed of conductive materials, such as those described above in relation to the first and second electrodes 102 or 106. The set of storage media 206 can be formed of material such as those described above in relation to storage medium 104.

After the storage cells of the array 200 are initially formed, the storage media 206 of the storage array 200 is to be initialized before it is capable of being set to a desired state as describe with respect to FIG. 1. Initialization includes altering the state of the storage medium 206 to change the resistivity exhibited by the storage medium 206 from an initial or pristine value to one of a lesser resistive value or state. According to a particular implementation, write and erase operations to an RRAM device are not operational until the RRAM device has been initialized.

Following initialization, the storage medium 206 can be manipulated to alternate between the two or more resistive states, each of which exhibits a lower resistivity than the initial or pristine resistivity prior to initialization. For example, FIG. 3 includes a graph 300 illustrating operation of an RRAM storage cell having two resistive states. For example, the storage medium of the RRAM storage cell can exhibit a pristine resistivity 304 prior to initialization. Once initialized, the resistivity of the RRAM storage cell can be programmed or erased to alternate between an upper resistivity state 306 and a lower resistivity state 308. In an example, initialization includes applying a high voltage, such as at least 5 V across the storage cell. The potential can be generated by exposing the storage cells to a voltage source, a charged plasma, radiation, or the like.

Figure 3:
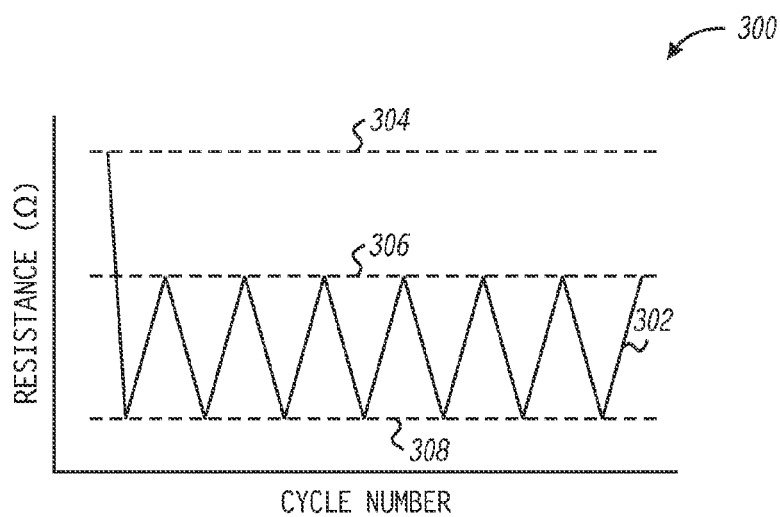
FIG. 3 includes a graph illustrating a change in resistance during use of an RRAM storage cell.

Following initialization, the storage cell can be driven, as illustrated by 302, between the upper resistivity state 306 and the lower resistivity state 308. The existence of the two states can be used to represent bit values for use in a computational system. As illustrated in FIG. 3, the resistivity states representing bit values exhibit a lower resistivity than the pristine resistivity (prior to initialization). In a particular example, the upper and lower resistivity states 306 or 308 can be at least two orders of magnitude lower than the initial resistivity 304.

Figure 4:
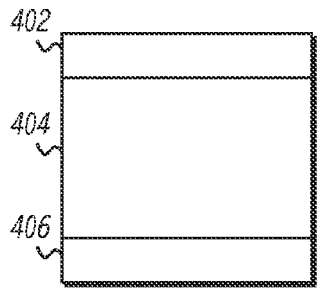
FIG. 4, FIG. 5, FIG. 6 and FIG. 7 include illustrations of an exemplary storage cell during initialization (also known as "forming" operation), reset and set operations.

While the present disclosure is not tied to a particular theory, FIGS. 4-7 illustrate a possible explanation as to the working of an RRAM storage cell, including the formation of conductive filaments within the storage medium. For example, as illustrated at FIG. 4, after fabrication, a storage cell 400 includes a storage medium 404 disposed between upper and lower electrodes 402 or 406.

Figure 5:
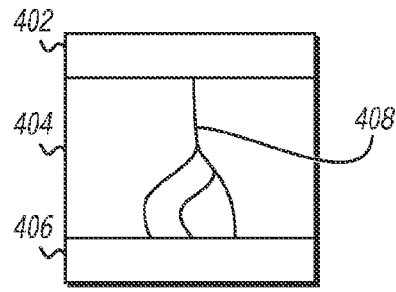

Upon initialization, one or more conductive filament (usually a plurality of conductive filaments) 408 are formed within the storage medium 404, as illustrated in FIG. 5. Under such a theory, the resistivity of the storage medium 404 drops to a lower resistive state. Such conductive filaments 408 can be formed, for example, by initializing with high-voltage potential, which can be produced using a voltage source, a charged plasma, radiation, or the like.

Figure 6:
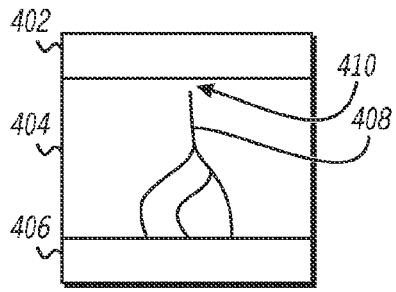
Figure 7:
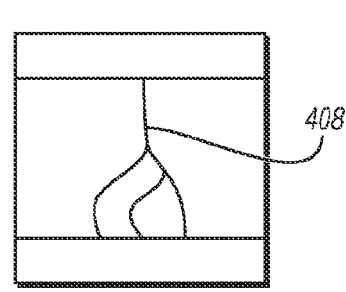

When alternating between resistive states, the conductive pathway 408 can be partially disrupted or broken usually close to the storage medium/electrode interface, as illustrated at 410 of FIG. 6. To establish a lower resistive state, the conductive filament can be re-established, as illustrated at FIG. 7. In such a manner, the storage medium can be manipulated between the resistive states illustrated in FIGS. 6 and 7 to represent stored bit values.

While FIGS. 4-7 illustrate the theoretical formation of conductive filament within a storage medium, other theories may explain the phenomenon that permits the formation of RRAM storage cells.

Figure 8:
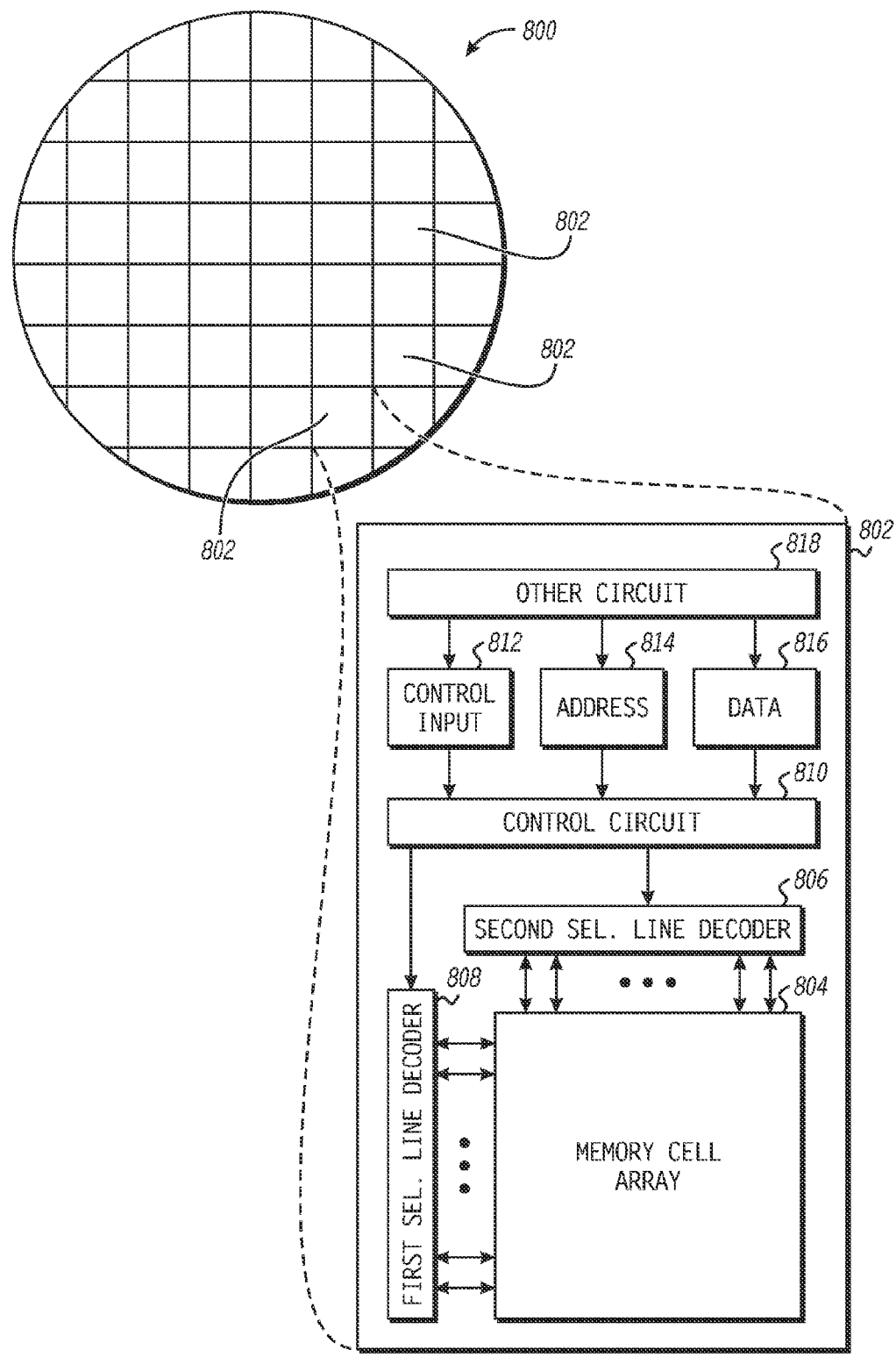
FIG. 8 includes an illustration of an exemplary wafer including a plurality of die.

In particular, storage cell arrays are formed on a die within a wafer. As illustrated in FIG. 8, a single substrate 800, such as a wafer, includes a plurality of die 802. Each die 802 can include a memory cell array 804 and optionally, a variety of other circuitries. For example, the die 802 can include a memory cell array 804 that includes a plurality of RRAM storage cells. First and second select line decoders 806 or 808 can be in communication with the memory cell array 804. A controller circuit 810 can be in communication with the first and second select line decoders 806 or 808 to drive access to and to facilitated the storage of data within the memory cell array 804. Further, the die 802 can include circuitry, such as a control input 812, address input 814, and data access 816, each connected to the control circuit 810. In addition, the die 802 can include other circuitry 818, such as microcontroller circuitry, smart sensor circuitry, a microprocessor circuitry, or other circuitry. Optionally, the other circuitry 818, such as a microprocessor, can communicate with the control input 8112, the address input 814, or the data access 816.

In a particular example, the circuitries and the RRAM storage cell arrays can be formed at a die of the wafer, and the RRAM storage cells of each die's storage cell array can be initialized while at the wafer level prior to separation of the die.

Figure 9:
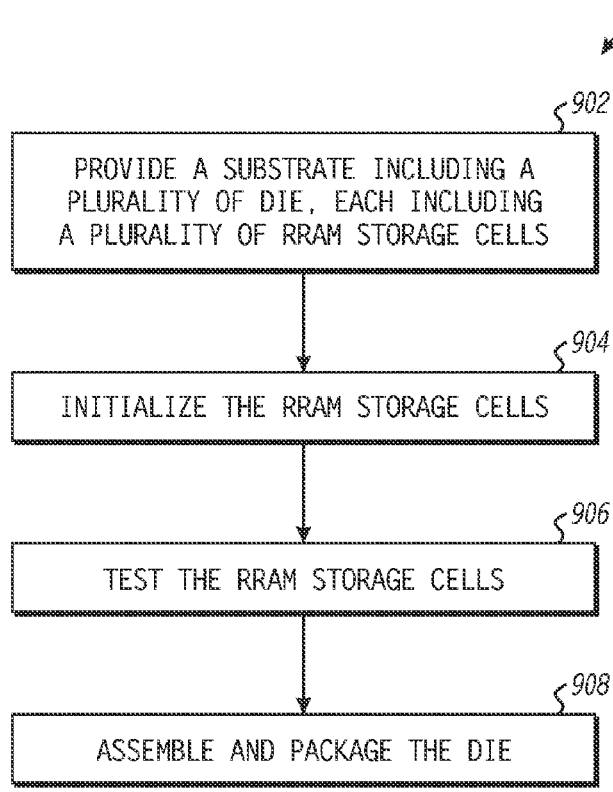
FIG. 9 includes an illustration of an exemplary method for forming a circuitry.

For example, as illustrated at FIG. 9, a method 900 includes providing a substrate including a plurality of die, as illustrated at 902. Each die includes a plurality of RRAM storage cells, such as in the form of an RRAM storage array. For example, as part of the process of forming circuitry to be included on individual die, a first set of electrodes can be formed, a set of storage media can be formed in contact with the first set of electrodes, and a second set of electrodes can be applied to contact the set of storage media opposite the first set of electrodes.

As illustrated at 904, the RRAM storage cells can be initialized at a wafer level by performing the activation on the wafer itself prior to separation of the wafer into die. For example, substantially all of the RRAM storage cells on the wafer can be initialized, such as at least 80% of the RRAM storage cells, at least 90%, or even at least 95% of the RRAM storage cells. Moreover, the RRAM storage cells can be initialized concurrently. In particular, substantially all of the RRAM storage cells of the wafer can be initialized concurrently. In one embodiment, a sacrificial layer, such as a conductive sacrificial layer, can be formed at the wafer in order to connect the RRAM portions of the wafer to a common conductive structure, or to a plurality of conductive structures that can be accessed concurrently during processing in order to initialize the RRAM memory cells. For example, a potential can be applied across the RRAM storage cells by contacting the sacrificial layer with one or more probes to connect an initializing voltage source. In another example, the wafer can be exposed to a charged plasma that results in a voltage potential occurring between the electrodes of each RRAM's memory cells. When exposed to a plasma for purposes of initializing, that the sacrificial conductive layer may or may not be used. Similarly, initializing the RRAM memory cells can include exposing the wafer to initializing radiation, such as ultraviolet radiation, gamma radiation, x-ray radiation, or a combination thereof, where an initializing radiation is radiation operable to initialize a storage media. Optionally, the sacrificial layer is present when exposing the wafer to a radiation.

Figure 10:
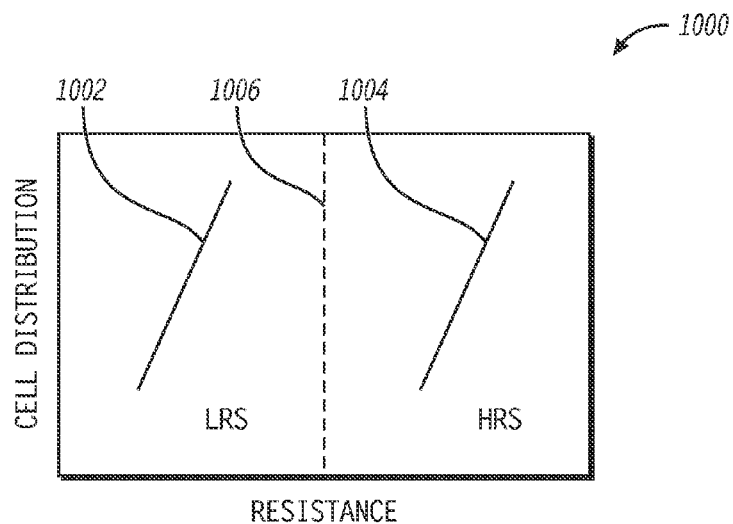
FIG. 10 includes a graph illustrating resistivity of a population of storage cells.

The wafer can further be tested, as illustrated at 906, to determine the operability of the RRAM storage cells. In an example, testing of the RRAM storage cells can be performed to determine one or more good or bad die. In particular, the testing can determine whether the RRAM cell arrays within one or more of the die exhibit resistive states useful for representing data. For example, as illustrated in FIG. 10, a set of storage cells, such as RRAM storage cells, within a storage cell array can exhibit a lower resistivity state (LRS) distribution 1002 over a resistant domain and can exhibit a higher resistivity state (HRS) distribution 1004 over a different resistant domain. Providing the domains of the upper and lower resistive state distributions 1002 or 1004 do not overlap with a threshold 1006, the storage cells of the storage cell array can be used to represent data. The testing, as illustrated at 906, can be used to determine whether the storage cell arrays of an individual die within a wafer are functional. Those die identified as having functionality within the storage cell array can be processed further for assembly, while those die lacking functionality from the storage cell arrays can be discarded.

Alternatively, the testing at the wafer level can be used to determine the effectiveness of initializing. Initializing can be repeated one or more times based on the testing results. For example, initializing can be repeated and tested, followed by re-initializing until a number of storage cells of the storage cell arrays are considered functional. Individual RRAM memory locations deemed nonfunctional can be recorded in order to omit their use during final operation.

Following identification of functional die, the wafer can be sent to assembly and packaging, as illustrated at 908, to form individual die and to be integrated into devices.

Figure 11:
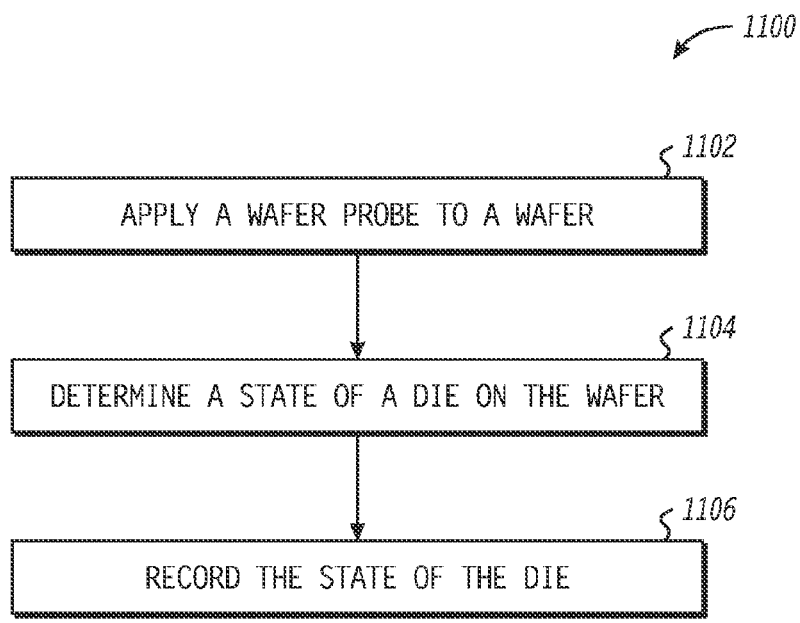
FIG. 11 includes a block flow diagram of an exemplary testing method.

In a particular example illustrated in FIG. 11, a method 1100 for testing can include inserting a wafer into a probe system and applying a wafer probe to the wafer, as illustrated at 1102. In particular, the wafer probe can be used to apply voltage potentials across the storage cells in the storage cell array to determine whether such storage cells function within the two or more resistive states desired to represent data bits.

Based on the functionality of the storage cell arrays, the state of the die on the wafer can be determined, as illustrated at 1104. For example, the die can be determined to be functional based on the functionality of RRAM storage cell arrays on the die. Alternatively, the die can be designated inoperable when the RRAM storage cell array does not functional to store data bits.

Following determination of the state of the die on the wafer, the state can be recorded, as illustrated at 1106. Such a die state can be utilized during later processing steps to determine whether to discard or keep a die, or can be utilized to designate functionality of a die. In a particular example, a die can include one or more RRAM cell arrays. Such cell arrays lacking functionality can be designated or restricted from use and the die can be labeled as having a lower memory capacity different from a die including a fully functional set of RRAM storage cell arrays.

Figure 12:
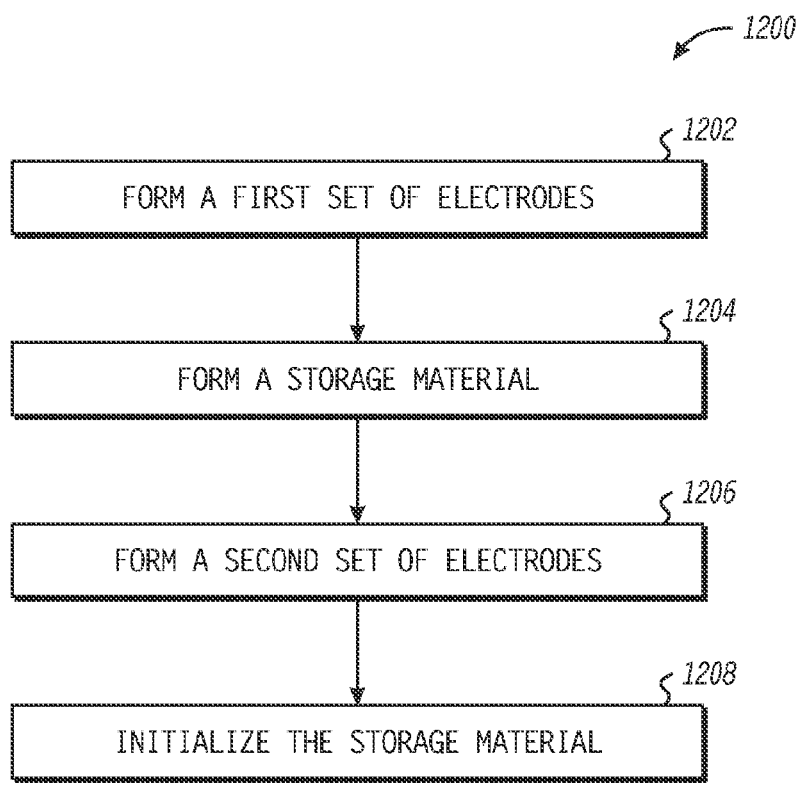
FIG. 12, FIG. 13, FIG. 14, and FIG. 15 include block flow diagrams illustrating exemplary methods of forming computational circuitries.

In general, RRAM cell arrays can be formed by a method 1200, as illustrated in FIG. 12. For example, the method 1200 includes forming a first set of electrodes, as illustrated at 1202. The first set of electrodes can be bit line select electrodes. Alternatively, the first set of electrodes can be word line select electrodes. The first set of electrodes can be formed of a conductive material, such as those described above.

A storage material can be formed over the first set of electrodes, as illustrated at 1204. For example, the storage material can be formed as a set of storage media in contact with the first set of electrodes. The storage media can include a storage material such as those described above. Further, each of the storage media can be formed of a single layer or a set of layers.

As illustrated at 1206, a second set of electrodes is formed in contact with the set of storage media opposite the first set of electrodes. The second set of electrodes can include a conductive material, such as those described above.

Following formation, the storage media are initialized, as illustrated at 1208. For example, substantially all of the storage media can be initialized concurrently. Initializing can be performed using a variety of techniques, such as applying a potential across the first and second set of electrodes, exposing the storage media to a charged plasma, or exposing such media to radiation. The material and the structure of the storage media can influence the selection of an activation procedure.

Figure 13:
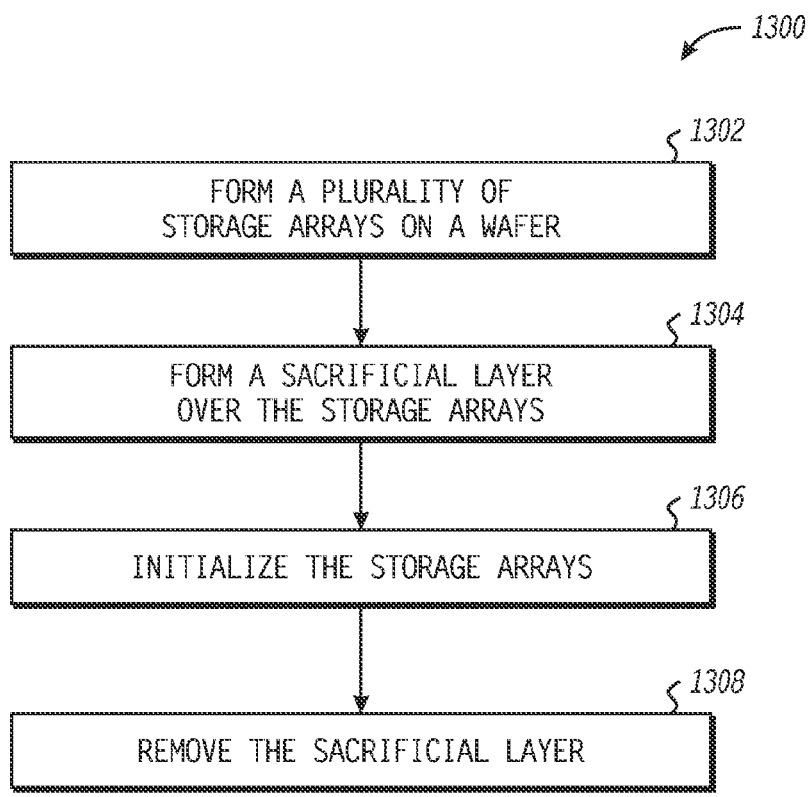

For example, as illustrated in a method 1300 of FIG. 13, the plurality of storage cell arrays can be formed on a wafer, as illustrated at 1302. A sacrificial layer can be formed over the circuitries, as illustrated at 1304. For example, a sacrificial layer can be a conductive material in contact with one of the sets of electrodes where the sacrificial layer can be readily contacted by a test fixture, or otherwise have a potential applied thereto. Optionally, protective layers can also be applied over other circuitry formed on the die to prevent exposure of such circuitry to initialization environments, such as plasma or radiation.

The storage cell arrays can be initialized, as illustrated at 1306. In particular, the wafer can be inserted into a probe station. The probe station can apply a wafer probe or probes to the sacrificial layer. In an example, the wafer probe can apply a voltage potential across the storage cells of the storage cell arrays, initializing the cells. In another example, a radiation source or plasma source that results in a charge on the sacrificial layer can be utilized to initialize the storage cell arrays. Additional sacrificial layers or protective layers can be applied over portions of the wafer include circuitry sensitive to plasma or initializing radiation.

Once the storage cell arrays are initialized, the sacrificial layer can optionally be removed, as illustrated at 1308. For example, the sacrificial layer can be etched or polished from the surface of the wafer.

Figure 20:
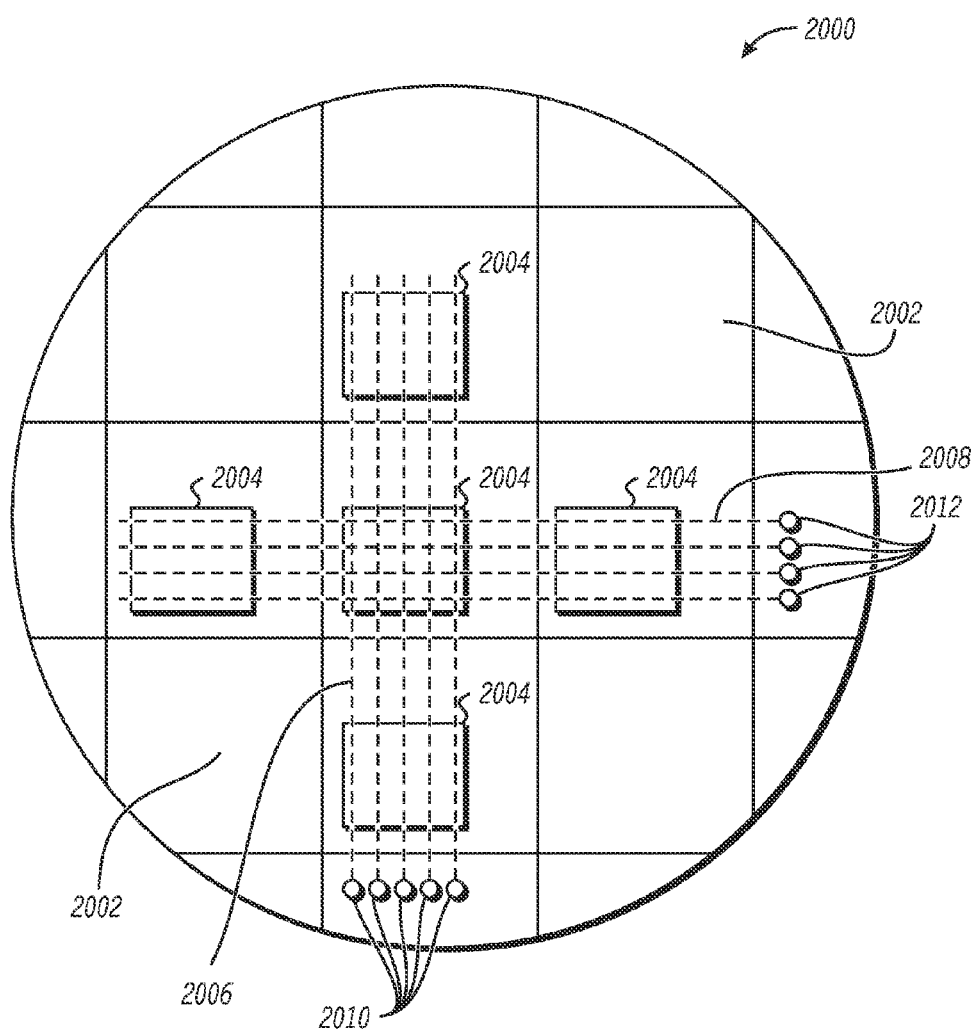
FIG. 20 includes an illustration of an exemplary initialization circuitry.

For example, as illustrated in FIG. 20, a wafer 2000 can include a plurality of die 2002. Each die can include an RRAM circuitry 2004. Initialization lines 2006 or 2008 can connect the pads 2010 or 2012 to one or more of the RRAM circuitry 2004. Probes can be applied to the pads 2010 or 2012 to assist with initialization of the RRAM circuitries 2004 or testing the operability of the RRAM circuitries 2004 at a wafer level. Such wafer level initialization lines 2006 or 2008 can be removed as part of the process of fabricating components from each die 2002 or can remain as part of circuitry once the die 2002 are separated.

Figure 14:
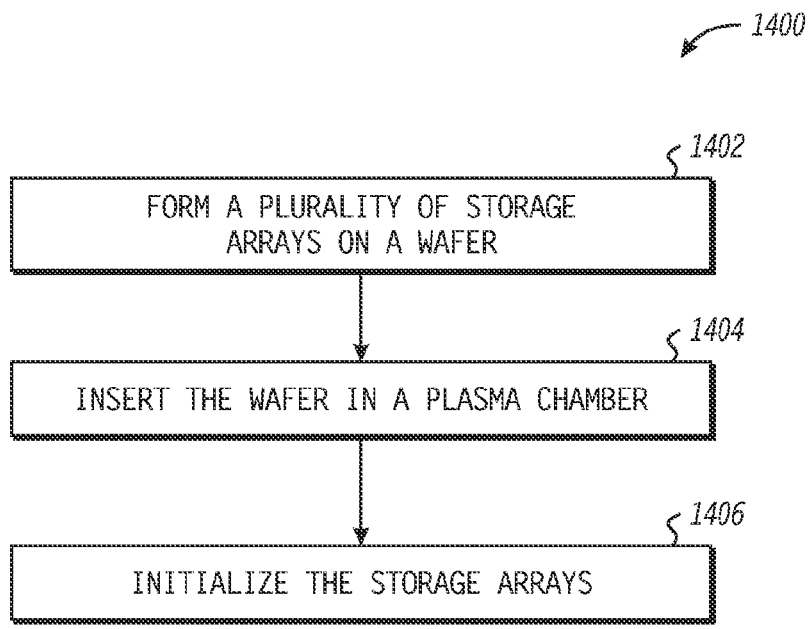

In a further example of activation, a method 1400 illustrated in FIG. 14 includes forming a plurality of storage cell arrays on a wafer, as illustrated at 1402. The wafer can be inserted into a plasma chamber, as illustrated at 1404. In such an example, the storage cell arrays of the wafer can be initialized using a charged plasma formed within the plasma chamber, as illustrated at 1406. Optionally, when forming the plurality of storage cell arrays of the wafer, protective layers can be applied over circuitry sensitive to charged plasma prior to inserting the wafer into the plasma chamber.

Figure 15:
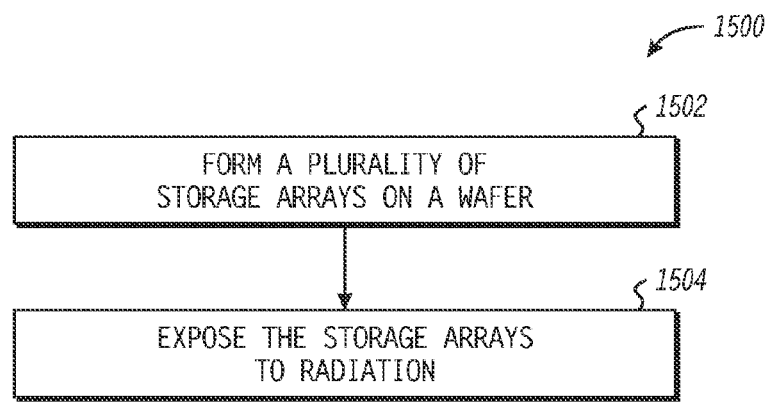

In an additional example of initializing, a method 1500 illustrated in FIG. 15 includes forming a plurality of storage cell arrays on a wafer, as illustrated at 1502. Optionally, protective layers can be formed over circuitry on the wafer that is sensitive to radiation. Such protective layers can be opaque to a particular radiation used to initialize the cell arrays.

Once formed, the storage cell arrays can be exposed to initializing radiation, as illustrated at 1504. In an example, the initializing radiation includes ultraviolet radiation. In another example, the initializing radiation includes gamma radiation. In a further example, the initializing radiation includes x-ray radiation. Alternatively, the initializing radiation can include exposure to a combination of radiation within the spectra of one or more of UV, gamma, or x-ray.

Figures 16, 17:
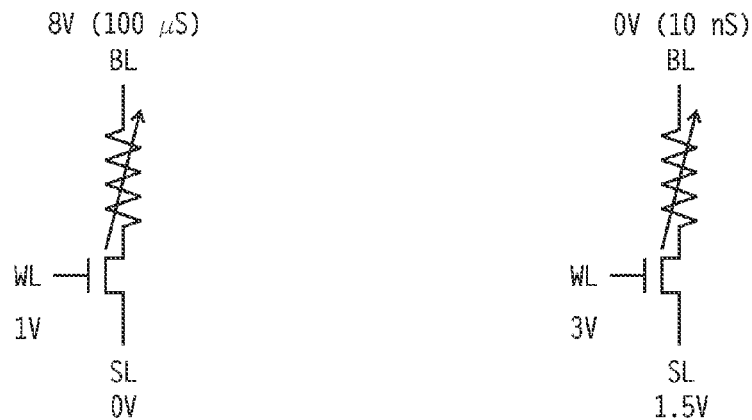
FIG. 16, FIG. 17, FIG. 18, and FIG. 19 include illustrations of exemplary circuitry including an RRAM storage cell.
Figures 18, 19:

In a particular example, each storage medium of a storage cell can be operated by manipulating a voltage potential and current across the storage cell. For example, as illustrated in FIGS. 16-19, voltage potential applied across storage medium can be used to initialize, reset, set or read the state of the storage medium. Current can be controlled using a transistor in series with the storage medium. As illustrated at FIG. 16, a large voltage difference can be applied across a bit line (BL) and a source line (SL), such as an 8V difference in a pulse, such as a pulse of 100 µs. As a result, the storage medium of the RRAM storage cell is initialized. Such initialization is characterized by reduced resistivity across the storage medium. The storage medium can be reset, as illustrated in FIG. 17 by applying a negative voltage potential across the storage medium. In the example illustrated in FIG. 17, a −1.5 V difference is applied for 10 ns. The storage medium can be set by applying a 2V difference between the bit line (BL) and source line (SL), as illustrated at FIG. 18. Whether set or reset, the state the storage cell can be read using a low voltage difference, as illustrated in FIG. 19, in which the difference between the bit line (BL) and source line (SL) is −0.1 V. In each of the examples, the current through the storage medium can be controlled by a word line (WL). In particular, the voltage applied at the word line (WL) can vary based on the operation. The above illustrated voltages are provided for example only. Voltages and pulse lengths utilized to initialize, reset, set, or read a storage medium vary based on the nature of the material of the storage medium.

In a first aspect, a method of forming a circuitry includes providing a substrate comprising a plurality of die, each die comprising a plurality of RRAM storage cells, and concurrently initializing substantially all of the RRAM storage cells.

In an example of the first aspect, concurrently initializing includes altering an initial resistivity of substantially all of the RRAM storage cells.

In another example of the first aspect and the above examples, concurrently initializing comprises generating a voltage potential across a storage medium region of the plurality of RRAM storage cells.

In a further example of the first aspect and the above examples, concurrently initializing is performed in a plasma chamber.

In an additional example of the first aspect and the above examples, concurrently initializing includes exposing the RRAM storage cells to a plasma charge.

In an example of the first aspect and the above examples, the method further includes forming a conductive sacrificial layer over the plurality of RRAM storage cells. For example, concurrently initializing includes providing a potential to the conductive sacrificial layer. In an example, concurrently initializing occurs at a wafer probe station. In another example, concurrently initializing includes exposing the conductive sacrificial layer to a plasma charge. In a further example, concurrently initializing includes exposing the sacrificial layer to an initializing radiation. In an additional example, the method can further include removing the sacrificial layer.

In another example of the first aspect and the above examples, concurrently initializing includes exposing the sacrificial layer to an initializing radiation.

In a further example of the first aspect and the above examples, the initializing radiation includes ultraviolet radiation.

In an additional example of the first aspect and the above examples, the initializing radiation includes gamma radiation.

In an example of the first aspect and the above examples, the initializing radiation includes x-ray radiation.

In another example of the first aspect and the above examples, the method further includes testing each die subsequent to initializing to identify operable storage cell arrays.

In an additional example of the first aspect and the above examples, for each die, the plurality of RRAM storage cells is not coupled to a high voltage circuitry.

In a further example of the first aspect and the above examples, the high voltage circuitry has a voltage of at least 5 volts.

In an example of the first aspect and the above examples, the method further includes forming the plurality of RRAM storage cells, wherein forming includes forming a first set of electrodes; depositing a set of storage structures in communication with the first set of electrodes; and forming a second set of electrodes in communication with the set of storage structures. For example, initializing includes altering an initial resistivity of the set of storage structures to a resistivity at least two orders of magnitude lower than the initial resistivity.

In a second aspect, a circuitry including an RRAM storage cell array is formed by a method including providing a substrate comprising a plurality of die, each die comprising a plurality of RRAM storage cells and concurrently initializing substantially all of the RRAM storage cells.

In an example of the second aspect, the circuitry is free of a high voltage circuitry.

In a third aspect, a computational device includes an RRAM storage cell array, first and second line selection circuitry connected to the RRAM storage cell array, and a control circuitry connected to the first and second line selection circuitry, wherein the computational device is free of a high voltage circuitry in communication with the RRAM storage cell array.

In a fourth aspect, a method of forming a circuitry includes forming a plurality of RRAM storage cell arrays on a wafer and applying a charged plasma to the wafer, the charged plasma initializing storage media of the RRAM storage cell arrays.

In an example of the fourth aspect, the method further includes applying a protective layer over a portion of the wafer.

In another example of the fourth aspect and the above examples, the storage media are initialized concurrently.

In a fifth aspect, a method of forming a circuitry includes forming a plurality of RRAM storage cell arrays on a wafer and applying initializing radiation to the wafer, the initializing radiation initializing storage media of the RRAM storage cell arrays.

In an example of the fifth aspect, the method further includes applying a protective layer over a portion of the wafer. For example, the protective layer is opaque to the initializing radiation.

In another example of the fifth aspect and the above examples, the storage media are initialized concurrently.

In a sixth aspect, a method of forming a circuitry includes forming a plurality of RRAM storage cell arrays on a wafer and applying a voltage potential across storage media of the RRAM storage cell arrays, the voltage potential initializing the storage media.

In an example of the sixth aspect, the method further includes applying a conductive sacrificial layer over the RRAM storage cell arrays of the wafer. For example, initializing includes applying a wafer probe to the conductive sacrificial layer.

In another example of the sixth aspect and the above examples, the method further includes removing the conductive sacrificial layer after initializing.

In a further example of the sixth aspect and the above examples, the storage media are initialized concurrently.

Note that not all of the activities described above in the general description or the examples are required, that a portion of a specific activity may not be required, and that one or more further activities may be performed in addition to those described. Still further, the order in which activities are listed are not necessarily the order in which they are performed.

In the foregoing specification, the concepts have been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

As used herein, the terms "comprises," "comprising," "includes," "including," "has," "having" or any other variation thereof, are intended to cover a non-exclusive inclusion. For example, a process, method, article, or apparatus that comprises a list of features is not necessarily limited only to those features but may include other features not expressly listed or inherent to such process, method, article, or apparatus. Further, unless expressly stated to the contrary, "or" refers to an inclusive- or and not to an exclusive- or. For example, a condition A or B is satisfied by any one of the following: A is true (or present) and B is false (or not present), A is false (or not present) and B is true (or present), and both A and B are true (or present).

Also, the use of "a" or "an" are employed to describe elements and components described herein. This is done merely for convenience and to give a general sense of the scope of the invention. This description should be read to include one or at least one and the singular also includes the plural unless it is obvious that it is meant otherwise.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

After reading the specification, skilled artisans will appreciate that certain features are, for clarity, described herein in the context of separate embodiments, may also be provided in combination in a single embodiment. Conversely, various features that are, for brevity, described in the context of a single embodiment, may also be provided separately or in any subcombination. Further, references to values stated in ranges include each and every value within that range.

What is claimed is:

1. A method of forming a circuitry, the method comprising:
    providing a substrate comprising a plurality of die, each die comprising a plurality of cells each including a storage medium disposed between two electrodes; and
    concurrently altering the storage medium of substantially all of the cells of the plurality of die to provide resistive random access memory (RRAM) storage cells adjustable to two or more resistive states.

2. The method of claim 1, wherein concurrently altering comprises generating a voltage potential across a storage medium region of the plurality of RRAM storage cells.

3. The method of claim 1, wherein concurrently altering is performed in a plasma chamber.

4. The method of claim 3, wherein concurrently altering includes exposing the plurality of cells to a plasma charge.

5. The method of claim 1, further comprising forming a conductive sacrificial layer over the plurality of cells.

6. The method of claim 5, wherein concurrently altering comprises providing a potential to the conductive sacrificial layer.

7. The method of claim 5, wherein concurrently altering occurs at a wafer probe station.

8. The method of claim 5, wherein concurrently altering includes exposing the conductive sacrificial layer to a plasma charge.

9. The method of claim 5, wherein concurrently altering includes exposing the sacrificial layer to an initializing radiation.

10. The method of claim 9, wherein the initializing radiation includes ultraviolet radiation.

11. The method of claim 9, wherein the initializing radiation includes gamma radiation.

12. The method of claim 9, wherein the initializing radiation includes x-ray radiation.

13. The method of claim 5, further comprising removing the sacrificial layer.

14. The method of claim 1, further comprising:
   testing each die subsequent to concurrently altering to identify operable storage cell arrays.

15. The method of claim 1, wherein, for each die, the plurality of RRAM storage cells is not coupled to a high voltage circuitry.

16. The method of claim 1, further comprising forming the plurality of cells, wherein forming comprises:
   forming a first set of electrodes;
   depositing a set of storage structures comprising the storage medium in communication with the first set of electrodes; and
   forming a second set of electrodes in communication with the set of storage structures.

17. The method of claim 16, wherein concurrently altering includes altering an initial resistivity of the set of storage structures to a resistivity at least two orders of magnitude lower than the initial resistivity.

18. A circuitry including a resistive random access memory (RRAM) storage cell array formed by the method comprising:
   providing a substrate comprising a plurality of die, each die comprising a plurality of cells each including a storage medium disposed between two electrodes; and
   concurrently altering the storage medium of substantially all of the cells of the plurality of die to provide the resistive random access memory (RRAM) storage cells adjustable to two or more resistive states.

* * * * *